United States Patent
Coulter

(10) Patent No.: US 9,872,418 B2
(45) Date of Patent: Jan. 16, 2018

(54) PANEL

(71) Applicant: IDC SOLUTIONS PTY LTD, Marrickville, NSW (AU)

(72) Inventor: Niall Coulter, Redfern (AU)

(73) Assignee: IDC SOLUTIONS PTY LTD., Erskineville (AU)

(*) Notice: Subject to any disclaimer, the term of this patent is extended or adjusted under 35 U.S.C. 154(b) by 0 days.

(21) Appl. No.: 13/981,499

(22) PCT Filed: Oct. 29, 2012

(86) PCT No.: PCT/AU2012/001320
§ 371 (c)(1),
(2) Date: Jul. 24, 2013

(87) PCT Pub. No.: WO2013/059883
PCT Pub. Date: May 2, 2013

(65) Prior Publication Data
US 2013/0309440 A1   Nov. 21, 2013

(30) Foreign Application Priority Data
Oct. 28, 2011   (AU) .............................. 2011904506

(51) Int. Cl.
*H05K 7/14*   (2006.01)
*H05K 7/18*   (2006.01)
(Continued)

(52) U.S. Cl.
CPC ......... *H05K 7/20836* (2013.01); *G06F 1/183* (2013.01); *H05K 7/14* (2013.01);
(Continued)

(58) Field of Classification Search
CPC ....... H05K 7/1489; F16B 5/126; F16B 21/08; F16B 21/088; Y10T 428/24182
(Continued)

(56) References Cited

U.S. PATENT DOCUMENTS 2,272,227 A * 2/1942 Thomas .................... E04C 2/36
267/23
3,389,519 A * 6/1968 Williams ................ E04C 2/296
264/46.5
(Continued)

FOREIGN PATENT DOCUMENTS

CN         201274030 Y * 7/2009
WO   WO 2011/066084 A1   6/2011

OTHER PUBLICATIONS

Abstract of CN 201274030 Y, provided by Derwent.*
(Continued)

*Primary Examiner* — Aaron Austin
*Assistant Examiner* — Zheren J Yang
(74) *Attorney, Agent, or Firm* — Moser Taboada

(57) ABSTRACT

A panel having a pair of longitudinally extending side edges, spaced apart end edges located between said side edges, and first and second substantially planar side surfaces located between said side and end edges. Strengthening means is located along and extending away from the one side surface. Snap locking engagement means extends away from the one side surface and is located adjacent said end edges. The engagement means in use is operable to secure said panel to a structure.

8 Claims, 9 Drawing Sheets

(51) Int. Cl.
  *G06F 1/18*    (2006.01)
  *H05K 7/20*    (2006.01)
(52) U.S. Cl.
  CPC .......... *H05K 7/1487* (2013.01); *Y10T 428/15* (2015.01); *Y10T 428/24008* (2015.01); *Y10T 428/2457* (2015.01); *Y10T 428/24182* (2015.01)
(58) Field of Classification Search
  USPC ........................................ 24/581.11; 428/120
  See application file for complete search history.

(56) References Cited

U.S. PATENT DOCUMENTS

| | | | | |
|---|---|---|---|---|
| 3,762,574 | A * | 10/1973 | Bentley | H05K 7/1405 211/41.17 |
| 3,838,777 | A * | 10/1974 | Thornicroft | H05K 7/1425 211/41.17 |
| 4,183,602 | A * | 1/1980 | Meunier | H05K 7/1409 439/157 |
| 4,478,899 | A * | 10/1984 | Mayumi | B62D 25/02 296/63 |
| 4,891,250 | A | 1/1990 | Weibe et al. | |
| 5,044,506 | A * | 9/1991 | Brown | H05K 7/1425 211/26 |
| 5,485,672 | A * | 1/1996 | Carpenter | H05K 7/1417 174/254 |
| 5,593,219 | A * | 1/1997 | Ho | G06F 1/181 220/4.02 |
| 5,639,522 | A * | 6/1997 | Maki | B60R 13/04 156/211 |
| 5,644,477 | A | 7/1997 | Klein | |
| 5,649,766 | A * | 7/1997 | Blake | H05K 7/207 374/137 |
| 5,669,524 | A * | 9/1997 | Loedel | H05K 7/1424 220/669 |
| 5,900,303 | A * | 5/1999 | Billarant | A44B 18/0076 24/442 |
| 5,992,914 | A * | 11/1999 | Gotoh | B60R 13/0206 280/751 |
| 6,386,120 | B1 * | 5/2002 | Nelson et al. | 108/134 |
| 6,885,550 | B1 | 4/2005 | Williams | |
| 7,627,973 | B2 * | 12/2009 | Lin et al. | 40/797 |
| 2001/0018979 | A1 * | 9/2001 | Dispenza | H05K 7/1425 174/382 |
| 2002/0105253 | A1 * | 8/2002 | Diaz | A45C 13/08 312/265.6 |
| 2002/0153338 | A1 * | 10/2002 | Orr | 211/183 |
| 2003/0207077 | A1 * | 11/2003 | Riha | B60R 13/02 428/120 |
| 2004/0004824 | A1 * | 1/2004 | Serjak | H05K 7/1418 361/796 |
| 2004/0232098 | A1 * | 11/2004 | Orr | A47B 47/03 211/183 |
| 2006/0081545 | A1 * | 4/2006 | Rassmussen | H05K 7/1425 211/26 |
| 2009/0059486 | A1 * | 3/2009 | Taylor | H05K 7/1488 361/679.02 |
| 2009/0178985 | A1 * | 7/2009 | Sempliner | H05K 7/1461 211/26 |
| 2009/0178991 | A1 | 7/2009 | Rasmussen et al. | |
| 2010/0014220 | A1 * | 1/2010 | Tai | F16M 11/00 361/679.01 |
| 2010/0027205 | A1 | 2/2010 | Cao | |
| 2011/0180315 | A1 * | 7/2011 | Medrano | H05K 7/1421 174/377 |
| 2011/0203844 | A1 * | 8/2011 | Pedoeem | H05K 9/0018 174/377 |
| 2012/0223198 | A1 * | 9/2012 | Grobe | G11B 33/124 248/225.21 |
| 2012/0274190 | A1 * | 11/2012 | Qin | H05K 7/1488 312/223.1 |
| 2013/0026292 | A1 * | 1/2013 | Dubost | B64C 1/064 244/117 R |
| 2013/0099066 | A1 * | 4/2013 | Chen | B29C 65/606 248/27.1 |
| 2013/0160372 | A1 * | 6/2013 | Chen | G06F 1/181 49/386 |
| 2014/0144858 | A1 * | 5/2014 | Yokosawa | H05K 7/1489 211/182 |

OTHER PUBLICATIONS

International Search Report dated Dec. 17, 2012 for Application No. PCT/AU2012/001320.
Extended European Search Report dated Dec. 13, 2016 for Application No. 12842709.3.
Australian Patent Examination Report dated May 5, 2016 for Patent Application No. 2012327875.

* cited by examiner

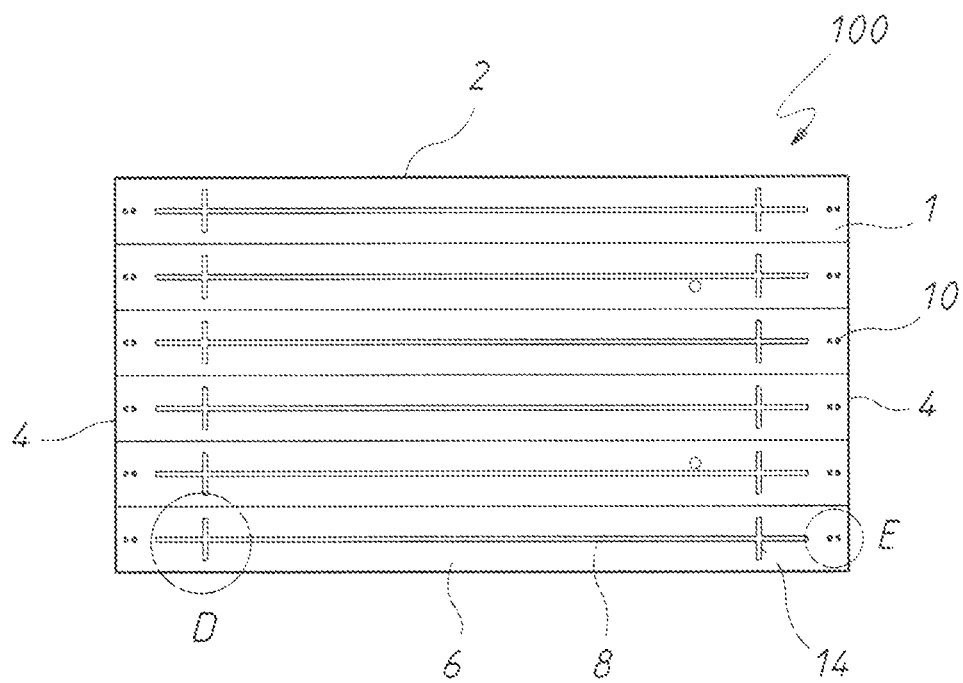
FIG.2
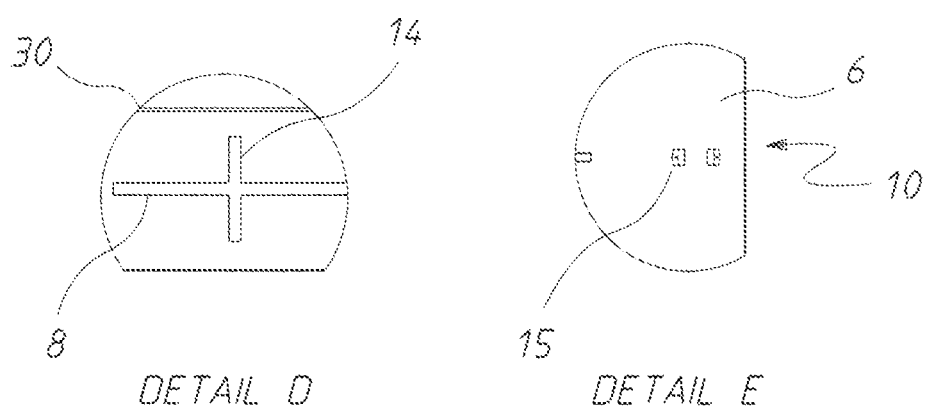
DETAIL D
DETAIL E
FIG.3a
FIG.3b

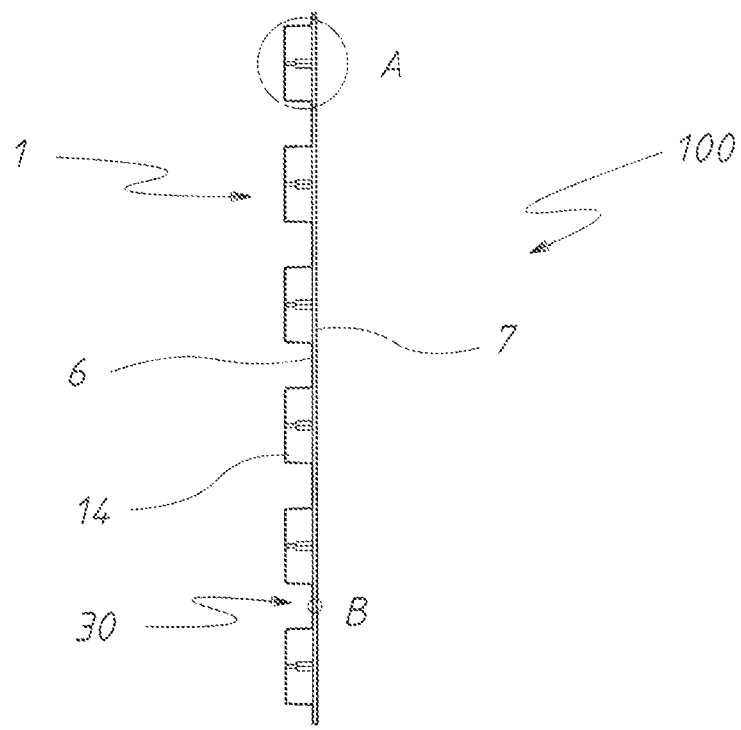
FIG. 4
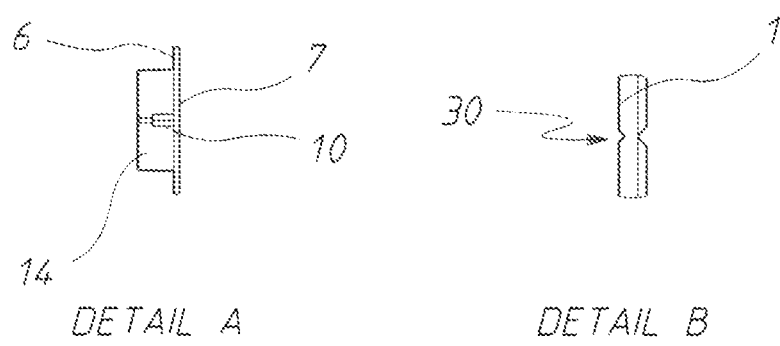
DETAIL A
DETAIL B
FIG. 5a
FIG. 5b

DETAIL C

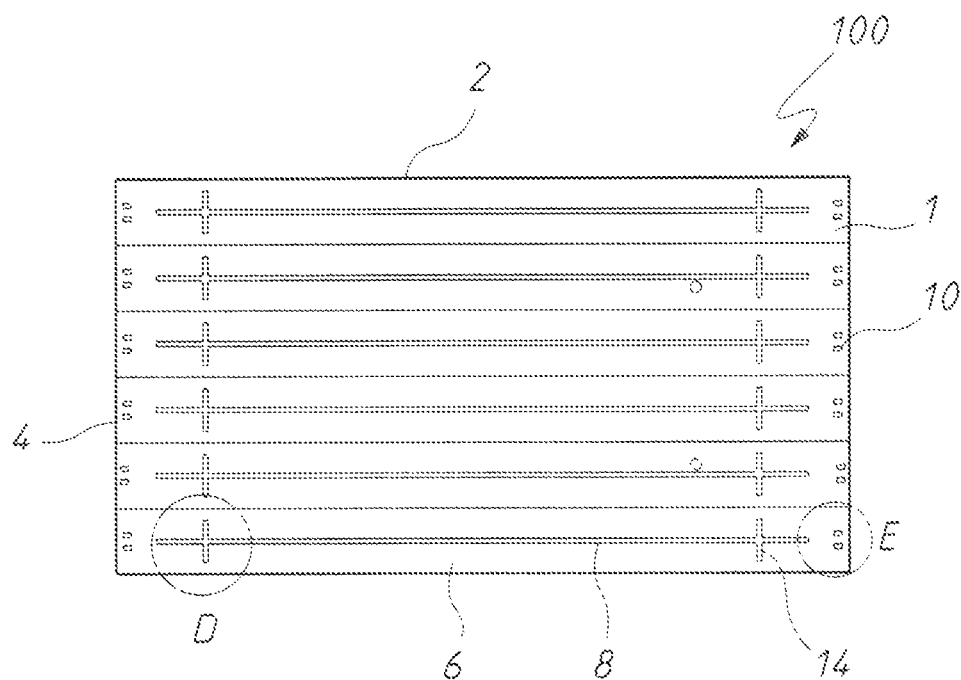
FIG.10
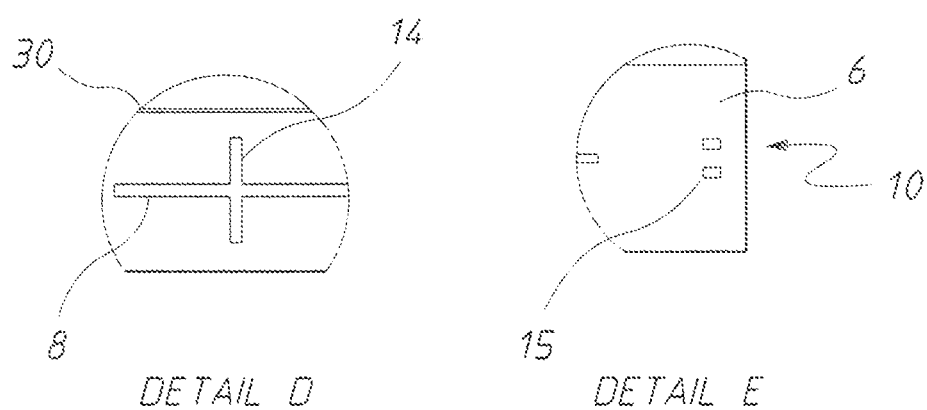
DETAIL D
FIG.11a
DETAIL E
FIG.11b

DETAIL A

DETAIL B

DETAIL C

PANEL

FIELD

The present invention relates to a panel and in particular to a plurality of modular panels for use with computer server rack units.

BACKGROUND

Most modern workplaces include one or more computer servers and other expensive electronics usually located within a server rack unit. A server rack unit is typically of a rectangular box shape extending from a ground surface and having at least one open side. The open side allows for technicians to insert and adjust componentry when needed. Computer servers and other electronic devices tend to generate heat. In some cases such devices include fans or the like exhausting hot air and heat away from the electronic devices. Server rack rooms typically also include computer room, air conditioning units (CRAC) or the like to counter the heat being generated by the electronic components located therein. In an attempt to keep electronic componentry located within the server rack unit cool, it has been known to encase the server rack unit in glass or the like and air condition the entire unit. This however prevents the hot air from being expelled and typically would have the hot air exhaust directly towards the cool air. This is not efficient and adds to power usage.

Accordingly, there is a need to keep the hot exhaust air away from the cool air intakes in a server rack unit extending the life of the equipment, saving energy and reducing the carbon footprint of a computer server and data centre.

There is also a need for a light weight adjustable panel strip that can be fitted to all size server rack units without the need of tools and that looks aesthetically pleasing.

OBJECT OF INVENTION

It is the object of the present invention to substantially overcome or at least ameliorate one or more of the above disadvantages.

SUMMARY OF INVENTION

There is disclosed herein a panel having:
a pair of longitudinally extending side edges, spaced apart end edges located between said side edges, and first and second substantially planar side surfaces located between said side and end edges;
strengthening means located along and extending away from one side surface; and
snap locking engagement means extending away from said one side surface and located adjacent said end edges, said engagement means in use operable to secure said panel to a structure.

Preferably, said strengthening means includes an elongate rib extending substantially along a length of said one side surface and substantially parallel to said side edges.

Preferably, said strengthening means includes one or more members extending perpendicular to said rib and substantially parallel to said end edges.

Preferably, including two or more snap locking engagement means.

Preferably, said snap locking engagement means is a clip.

Preferably, said clip includes means to secure said panel to a square or round hole.

Preferably, the clip includes a pair of resilient arms extending away from said one side surface, said arms in use operable to engage with a hole located in said structure.

Preferably, including at least one protuberance extending away from said one side surface and operable to locate said panel on said structure.

Preferably, including two or more said panels fixed together along a said side edge to form a sheet of parallel panels.

Preferably, said two or more panels are separable by application of a force.

Preferably, including temperature determination means.

Preferably, said means is a thermal liquid crystal label.

BRIEF DESCRIPTION OF DRAWINGS

A preferred embodiment of the present invention will now be described, by way of an example only, with reference to the accompanying drawings wherein:

FIG. 2 is a top view of FIG. 1;
FIGS. 3a and 3b are Detail D and Detail E of FIG. 2;
FIG. 4 is an end view of FIG. 1;
FIGS. 5a and 5b are Detail A and Detail B of FIG. 4;
FIG. 10 is a top view of FIG. 9;
FIGS. 11a and 11b are Detail D and Detail E of FIG. 10.

DESCRIPTION OF EMBODIMENTS

Figure 1:
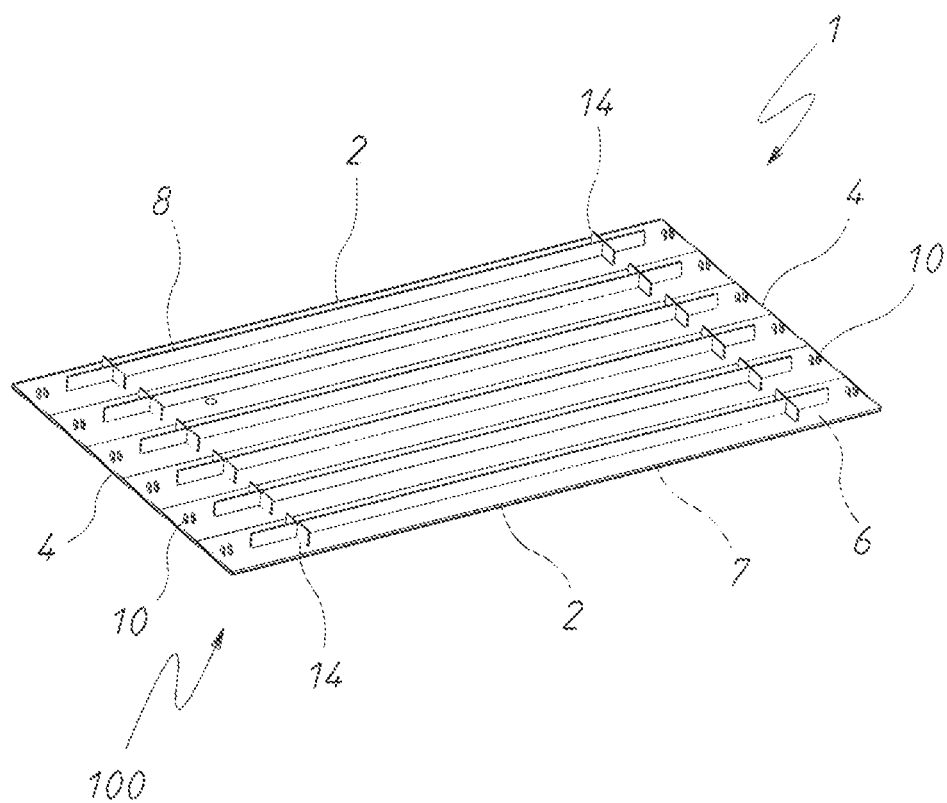
FIG. 1 is a perspective view of a sheet of panels of an embodiment of the present invention.
Figure 6:
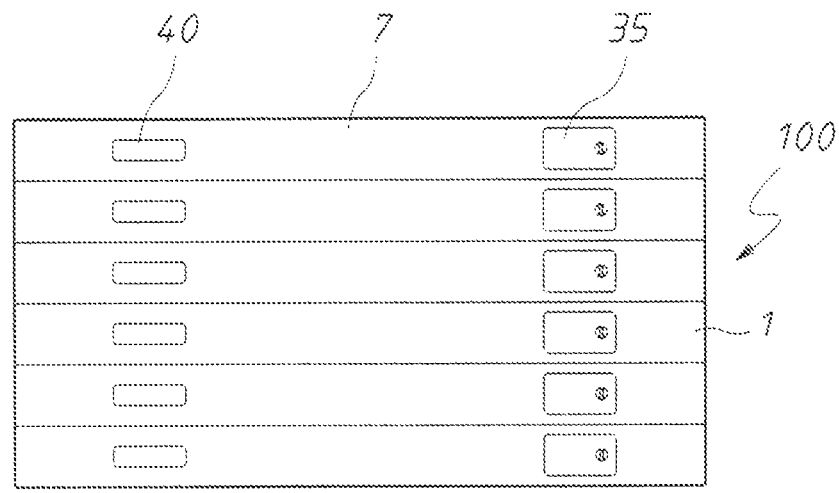
FIG. 6 is a bottom view of FIG. 1.
Figure 7:
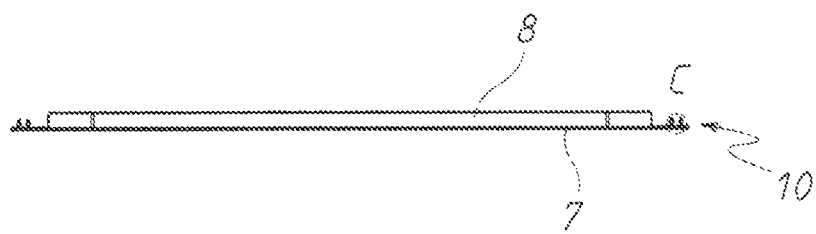
FIG. 7 is a side view of FIG. 6.
Figure 8:
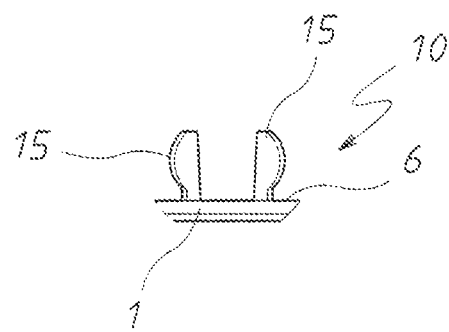
FIG. 8 is Detail C of FIG. 7.
Figure 9:
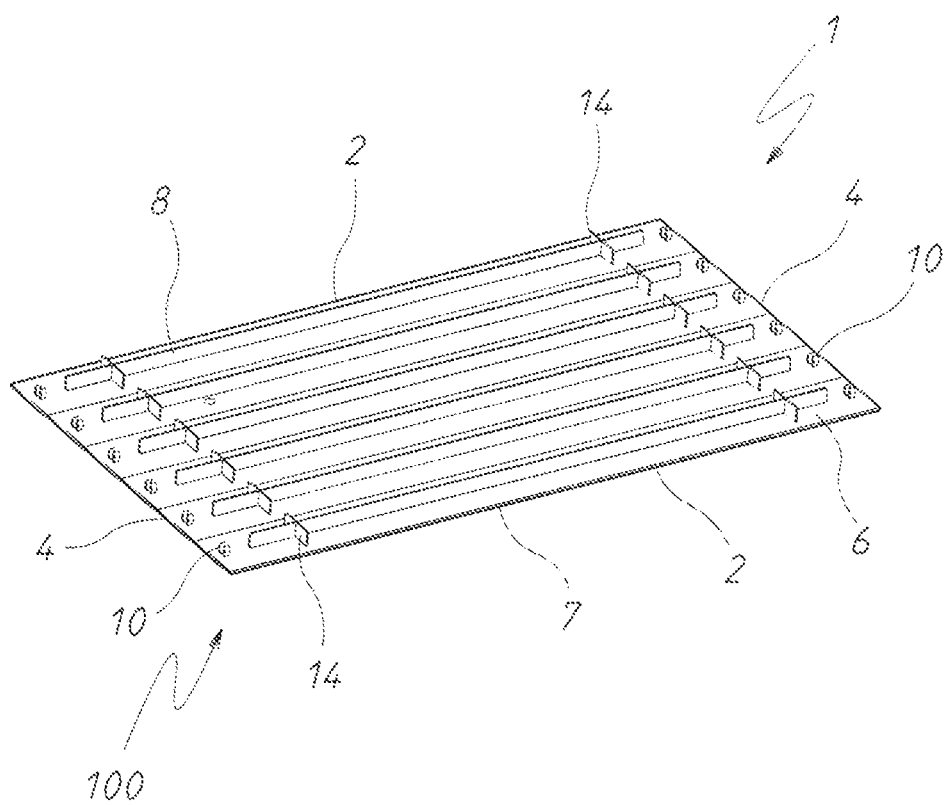
FIG. 9 is a perspective view of a sheet of panels of another embodiment of the present invention.
Figure 12:
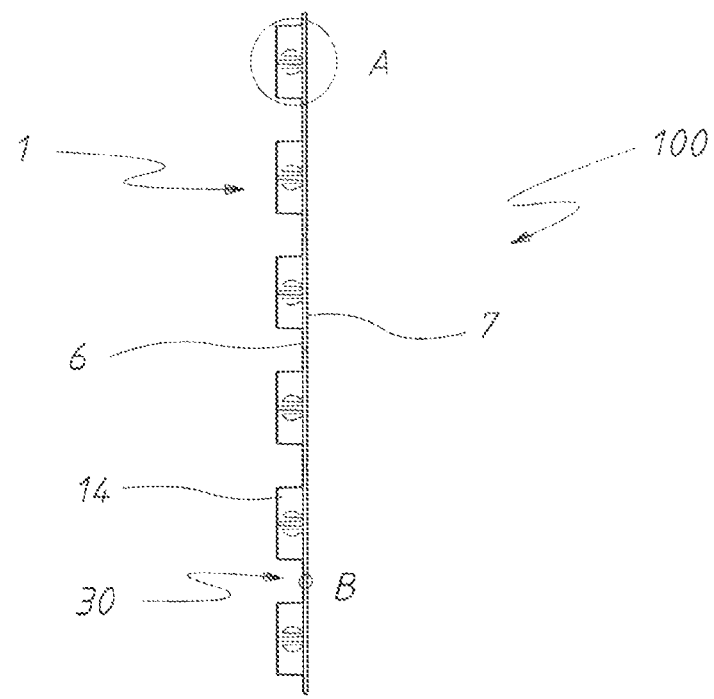
FIG. 12 is an end view of FIG. 9.
Figure 13A:
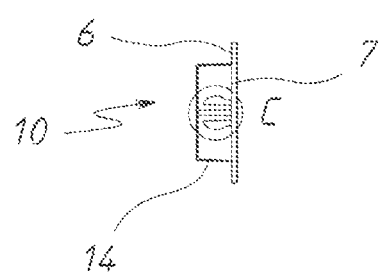
FIGS. 13a and 13b are Detail A and Detail B of FIG. 12.
Figure 13B:
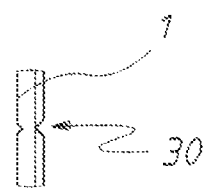
Figure 14:
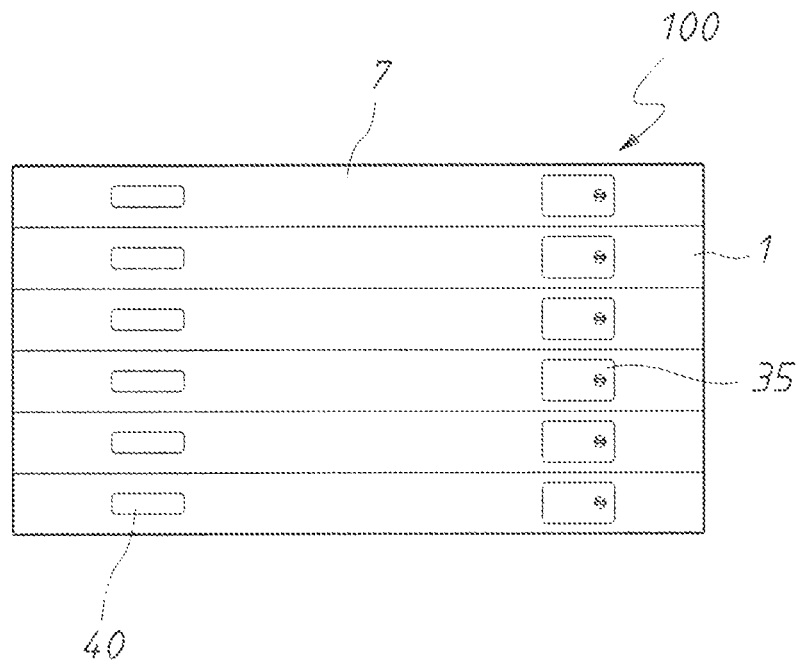
FIG. 14 is a bottom view of FIG. 9.
Figure 15:
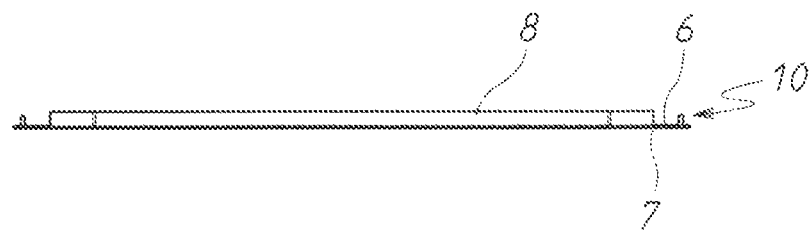
FIG. 15 is a side view of FIG. 14.
Figure 16:
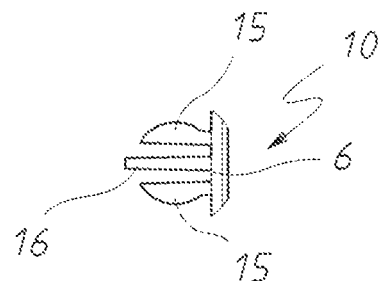
FIG. 16 is Detail C of FIG. 15.
Figure 17:
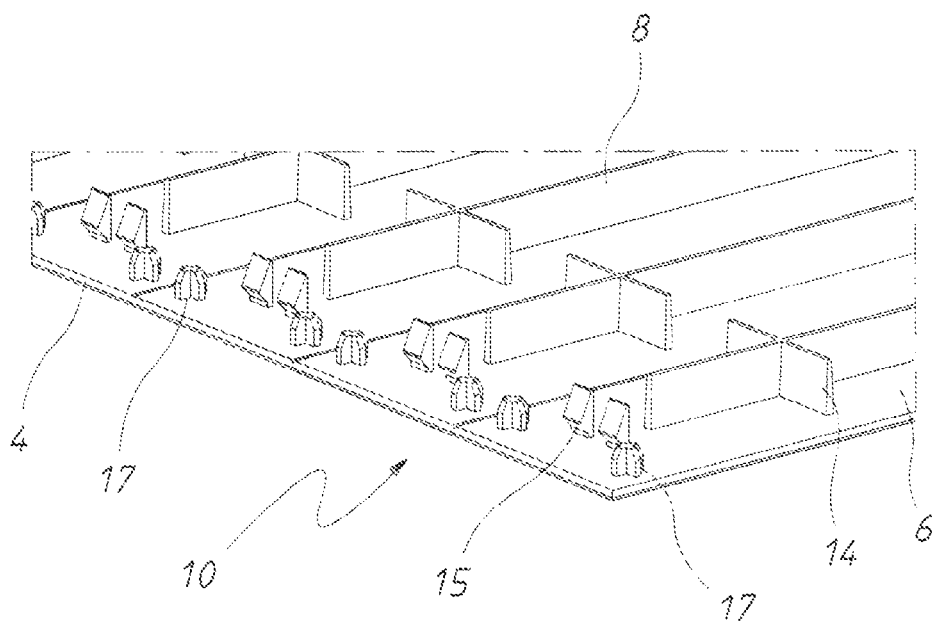
FIG. 17 is a perspective view of a further embodiment of the present invention.

There is disclosed herein a panel 1 having a pair of spaced apart longitudinally extending side edges 2 located between end edges 4. First and second substantially planar side surfaces 6, 7 are located between the side and end edges 2, 4. As best seen in FIG. 1 strengthening means 8 are located along and extend away from the side surface 6. Snap-locking engagement means 10 and are located adjacent the end edges 4 extending away from one of the side surfaces 6. The engagement means 10 in use are operable to secure the panel 1 to a structure (not shown). In a preferred form, the structure would be a computer server rack unit or the like. However, it should be understood that the panel 1 could be attached to other structures. The strengthening means 8 includes one or more elongate ridges 8 extending substantially along a length of the surface 6 and parallel to the side edges 2. Strengthening means 8 also includes one or more members 14 extending perpendicular to the rib 8 and parallel to the end edges 4 as best seen in FIG. 1. The panel 1 in a preferred form includes two or more snap-locking, engagement means 10 located adjacent the end edges 4 as best seen in FIG. 1. In the preferred form, the snap-locking engagement means 10 are in the form of a clip (see for example FIGS. 8, 16 and 17) which are adapted to secure to a square or round hole (not shown) on the structure (not shown) or for example on the rack of a computer server rack or other such structure. The clip 10 includes a pair of resilient arms 15 extending away from the side surface 6. As can be seen in the drawings these arms 15 can be oriented at different angles to each other. Each arm 15 in use is operable to engage with a hole, aperture or slot (not shown) located in the structure (not shown). A spike 16 could also be included to assist with locking the panel to the rack. In an alternate form and as shown in FIG. 17, two arms 15 (or catches) hook into the inside of a vertical rail (not shown) of a structure and two protuberances 17 in the form of position pointers are utilised to position the panel 1 with holes in the structure (9.5 mm square, 7.2 round and 4.6 threaded round). In a preferred form, and as best seen in figures two or more panels 1 can be fixed together along a side edge 2 forming a sheet 100 of parallel panels 1. The two or more panels 1 are separable by application of a force by a user. As best seen in FIGS. 5b and 13b a serration or groove 30 can be included to assist with separating the panels 1. Further, the panel 1 could include a temperature determination means 35 in the form of a thermal liquid crystal label. As best seen in the figures, the direction of the resilient arms 15 can be parallel to the side edges 2 or perpendicular to the side edges 2 depending upon the structure to be attached (see FIGS. 1 and 9).

In an aspect of the present invention therefore there is provided thermal separation performance improvements by closing the insertion holes on the face of the panel 1. A label placement area 40 can also be included on one side of the panel 1. The side surface 7 of this area 40 can have a finish best suited to attach an adhesive label. Plastic injection gates (not shown) can be located on third and fourth label placement areas, if required. These will be in line and improve the aesthetics of the sheet 100. The clips 10 shown are for use and installation into either computer server racks that have the 9.5 mm square holes or 7 mm round holes. It will however be understood that the clips 10 could be utilised in different holes or to attach to rails of other structures. The present invention could also include a thermal liquid crystal label 35. The thermal label could display different colours that represent predetermined temperature thresholds. For example, below 28 degrees Celsius is blue, at 28 degrees Celsius is green and above is red. The present invention therefore, in at least a preferred embodiment, keeps hot air away from cool air intakes, extends the life of equipment, saves energy and reduces the carbon footprint of a data centre. Adjustable panels 1 can be fitted to every size of rack unit from 1 to 6 for example and the snap-locking clips 10 allow the panels 1 to be installed or removed in seconds without the need for screws, tools or skilled workers.

The panel 1 is typically constructed by the injection of moulding ABS plastic, ABS Abstrene, into 2 steel moulds. The plastic is flame retardant (such as UL94V0) and is suitable for recycling.

The panel 1 typically comes in sheets of six Rack Units (RUs) with each 6 RU panel measuring 48.5×26.5 cm. Each 1×RU panel can be snapped off giving the flexibility for the product to pop in to an area. The six RU is a multiple of the two standard rack heights of 42 and 48.

The panel 1 advantageously includes (1) Pop in Clips 10; and (2) Snap-off Panels 1.

The clip 10 component of the panel 1 has been designed to reduce the time, labour costs, complexity and difficulty in installation of blanking panels 1. Previously, blanking panels 1 required the use of legacy screws for the installation of any blanking panel 1. The clip 10 eliminates the laborious task of installing the legacy screw in the panels 1. The clip 10 comes pre-installed onto the back of the panel 1. The clip 10 operates by closing as it is pressed through the rack-mounting hole and reopens to provide positive fastening.

The ability to snap-off a panel 1 has also been designed to reduce the time, labour costs, complexity and difficulty in installation of blanking panels 1. The panels 1 are made to international standards to fit standard rack rail holes. The panels 1 are lightweight, flexible, re-useable and resistant to pressure. The panels 1 feature pre-installed grooves; a spacer and/or interchangeable plates.

The panel 1 comes with pre-installed grooves 30, which enables the 6 RU's to be snapped/divided into the desired multiples of RU's for an installation. The grooves 30 enable the panel 1 to be snapped into and out of place with ease by creating an automatic weakness within the panel 1. Further, the groove 30 ensures that when an individual RU is required to be broken away from the panel 1, the resulting break remains even and straight.

Each RU panel contains one or more spacers or strengthening ribs 8, which serves a dual purpose. Firstly, the spacer 8 gives the panel rigidity and secondly, the spacer 8 protects the clip 10 in packing and transportation. The spacer 8 allows the panel 1 to be easily packed, stored and transported.

Each panel 1 contains interchangeable plates that allow customers to individualise the panel 1 by allowing the insertion of an individual company name, logo or symbol on to each individual RU.

The method of installing a panel 1 would include a user obtaining a panel sheet 100 having typically 6 panels connected together. A user would grasp the underside of the panel 1 at the row division required. Firmly bend along the grooves 30 on the panel 1 between the rows. The user will keep bending until a break appears between the rows, the user would then bend the panel 1 in the opposite directions until it has clearly snapped off the remaining sheet 100. The panel 1 would then be positioned in the required place on the server rack unit and the user would snap the clips 10 on the back of the panel into the holes on either side of the rack. The panel 1 is then located within the server rack.

Although the invention has been described with reference to specific examples, it will be appreciated by those skilled in the art that the invention may be embodied in many other forms.

The invention claimed is:

1. A sheet of two or more panels; each panel having:
   a pair of longitudinally extending side edges, spaced apart end edges located between said side edges, wherein said side and end edges define a periphery enclosing first and second substantially planar side surfaces located between said side and end edges;
   an elongate rib located along and extending away from said first side surface, the elongate rib extending parallel to the side edges, to a position proximal to but not overlapping with the end edges;
   at least one member having the same height as, and perpendicular to, the elongate rib, the at least one member extending away from said first side surface, and extending parallel to the end edges, to a position proximal to but not overlapping with the side edges;
   a snap locking engagement clip integrally formed on the panel and extending away from said first side surface and located adjacent each said end edge, said engagement clip in use operable to secure at least one panel in said sheet of two or more panels to a structure; and
   a groove extending along adjoining side edges of two adjacent panels of the two or more panels, the groove extending along the adjoining side edges and partially through the thickness of the two adjacent panels, the groove configured to assist with separating the two adjacent panels by application of a force, wherein the elongate rib is taller than the engagement clip, and wherein no walls extend from said first side surface along the periphery, in an orientation perpendicular to said first side surface.

2. The sheet of two or more panels according to claim 1, wherein said elongate rib extends substantially along a length of said one first side surface.

3. The sheet of two or more panels according to claim 1, wherein said clip secures each said panel in use to a square or round hole of a server rack.

4. The sheet of two or more panels according to claim 1, wherein the clip includes a pair of resilient arms extending away from said first side surface, said arms in use operable to engage with a hole located in said structure.

5. The sheet of two or more panels according to claim 1, including at least one protuberance extending away from said first side surface and operable to locate said panel to said structure.

6. The sheet of two or more panels according to claim 1, including a thermal liquid crystal label.

7. The sheet of two or more panels according to claim 5, wherein the elongate rib is taller than the at least one protuberance.

8. The sheet of two or more panels according to claim 1, wherein the sheet of two or more panels is packageable with at least one similar sheet of two or more panels, wherein the elongate rib protects the engagement clip.

\* \* \* \* \*